United States Patent
Asano et al.

(10) Patent No.: US 6,897,126 B2
(45) Date of Patent: May 24, 2005

(54) SEMICONDUCTOR DEVICE MANUFACTURING METHOD USING MASK SLANTING FROM ORIENTATION FLAT

(75) Inventors: Tetsuro Asano, Oizumi-machi (JP); Masahiro Uekawa, Oizumi-machi (JP); Koichi Hirata, Ashikaga (JP); Mikita Sakakibara, Moriguchi (JP)

(73) Assignee: Sanyo Electric, Co., Ltd., Osaka (JP)

( * ) Notice: Subject to any disclaimer, the term of this patent is extended or adjusted under 35 U.S.C. 154(b) by 0 days.

(21) Appl. No.: 10/189,775

(22) Filed: Jul. 8, 2002

(65) Prior Publication Data

US 2003/0017644 A1 Jan. 23, 2003

(30) Foreign Application Priority Data

Jul. 9, 2001 (JP) ........................................ 2001-207651

(51) Int. Cl.$^7$ ...................... H01L 21/301; H01L 21/46; H01L 21/78; H01L 21/00
(52) U.S. Cl. ...................... 438/460; 438/800
(58) Field of Search ............................. 438/460, 462, 438/464, 800; 257/618, 620, 666; 225/2

(56) References Cited

U.S. PATENT DOCUMENTS 5,182,233 A * 1/1993 Inoue ........................ 437/226
5,627,109 A    5/1997 Sassa et al.
5,923,054 A * 7/1999 Kobashi et al. ............. 257/103

FOREIGN PATENT DOCUMENTS

| EP | 0 562 880 | 9/1993 | |
|---|---|---|---|
| JP | 61-263124 | 11/1986 | |
| JP | 62224946 | * 10/1987 | |
| JP | 2-192753 | 7/1990 | |
| JP | 3-218050 | 9/1991 | |
| JP | 5-285935 | 11/1993 | |
| JP | 02192753 A | * 7/1999 | ........... H01L/21/78 |

OTHER PUBLICATIONS

Decker, D.R., "Monolithic Microwave Integrated Circuit", Coden MWSNA9, MSN Microwave Systems News, vol. 13, No. 7, pp. 84–92, Jul. 1983.*

Taiwan Office Action dated Jun. 12, 2003.

* cited by examiner

Primary Examiner—Craig A. Thompson
(74) Attorney, Agent, or Firm—Morrison & Foerster LLP

(57) ABSTRACT

In a method of manufacturing a compound semiconductor device, individual chip patterns are projected onto a (1 0 0) surface of a GaAs wafer so that the columns and rows of the chip patterns are aligned in a direction slanting by 45 degrees with respect to a [0 1 1] direction of the GaAs wafer. The wafer is diced along this slanting direction and chipping along the edges of the individual separated chips is greatly reduced.

6 Claims, 2 Drawing Sheets

[0 1̄ 1̄]

Prior Art

SEMICONDUCTOR DEVICE MANUFACTURING METHOD USING MASK SLANTING FROM ORIENTATION FLAT

BACKGROUND OF THE INVENTION

1. Field of the Invention

The invention relates to a manufacturing method of compound semiconductor device operating at high frequencies, specifically to a method which prevents chipping of compound semiconductor substrate during dicing process, and a compound semiconductor device made by the manufacturing method.

2. Description of the Related Art

The demand for high frequency devices has been rapidly increasing due to the expanding market for portable telephones and digital satellite communication equipment. Many of such devices include field effect transistors (referred to as FET, hereinafter) employing a gallium arsenide (referred to as GaAs, hereinafter) substrate because of its excellent high frequency characteristics. Typical application in this field includes local oscillation FETs and monolithic microwave integrated circuits (MMIC) in which a plurality of FETs are integrated.

In a typical semiconductor device manufacturing process, a semiconductor wafer in which semiconductor devices have been formed must be separated into individual devices. The most popular method to cut the wafer is to use a dicing saw. Such a method is well know and described in may publications including Japanese Laid Open Patent Publication No. Sho 60-34827.

FIG. 1 shows a conventional alignment of a GaAs wafer 12 with respect to a mask 11 having individual chip patterns 13. The GaAs wafer 12 is positioned with respect to the mask 11 using an orientation flat OF of the GaAs wafer as a positioning reference. Specifically, an edge of the mask 11 and the orientation flat OF is aligned so that the two directions are parallel to each other or perpendicular to each other. In such a configuration, all the chip patterns are aligned in directions parallel to and perpendicular to the edge of the mask 11. As indicated by an arrow in FIG. 1, the orientation flat OF is generally formed in a direction normal to a $[0\bar{1}\bar{1}]$ direction of the GaAs lattice. The surface of the GaAs wafer 12 is a (1 0 0) plane of the GaAs lattice and is exposed in a photolithographic process to form semiconductor devices such as GaAs FETs. The notation of surfaces and planes described in this specification is based on Miller indices.

During a dicing process of the GaAs wafer 12, a dicing blade is first positioned on a dicing region 14 formed on the primary plane of the GaAs wafer 12, and then cuts the GaAs wafer 12 along the dicing region 14. Because of chipping, a typical width of the dicing region 14 is 50 µm. Other operational parameters of dicing blades in this process include a cutting speed of about 6 mm/sec and a blade spin rate of about 30000 to 35000 rpm. After dicing, the GaAs wafer 12 which have been cut by the dicing blade is rinsed with water and then dried before being sent to a bonding process.

According to this conventional alignment of the mask, the chip patterns and the wafer, the wafer is diced in a direction parallel to or normal to the $[0\bar{1}\bar{1}]$ direction of the wafer. On a (1 0 0) plane of the GaAs lattice, the cleavage direction is either parallel to or normal to the $[0\bar{1}\bar{1}]$ direction. Thus, when the wafer is cut along a direction parallel to the $[0\bar{1}\bar{1}]$ direction, cleavage may easily occur along a direction normal to the cutting direction. Accordingly, when the GaAs wafer 12 is diced along this direction, a large amount of chipping occurs along this direction because of the cleavage induced by stresses generated at a contact between the rotating dicing blade and the surface of the GaAs wafer 12. Chipping is a crack formation at the surface cut by the dicing blade and leads to reduced yield of the manufacturing process. Because of the chipping, the width of the dicing region 14 should be wider than otherwise required, or the cutting speed should be slow so as not to induce a large amount of chipping.

SUMMARY OF THE INVENTION

The invention provides a manufacturing method of compound semiconductor device including providing a compound semiconductor wafer having an orientation flat and providing a mask having individual chip patterns. This is followed by positioning the mask with respect to the wafer so that the individual chip patterns of the mask are aligned in a direction slanting with respect to the orientation flat. The method further includes patterning the wafer using the mask positioned with respect to the wafer and dicing the patterned wafer.

The invention also provides a manufacturing method of compound semiconductor device including providing a compound semiconductor wafer having an orientation flat and providing a mask having individual chip patterns. This is followed by positioning the mask with respect to the wafer so that the individual chip patterns of the mask are aligned in a direction slanting by an angle between 30 and 60 degrees with respect to the orientation flat. The method further includes patterning the wafer using the mask positioned with respect to the wafer and dicing the patterned wafer in the direction slanting by an angle between 30 and 60 degrees with respect to the orientation flat.

The invention further provides a compound semiconductor device including a compound semiconductor substrate having a substantially rectangular shape. A primary surface of the substrate has a (1 0 0) surface of a compound semiconductor or a crystallographically equivalent surface thereof. An edge of the substrate slants by an angle between 30 and 60 degrees with respect to a [0 1 1] direction of the compound semiconductor or a crystallographically equivalent direction thereof.

DETAILED DESCRIPTION OF THE INVENTION

It is known in the art that chipping of a compound semiconductor substrate is greatly reduced when the substrate is diced along a direction slanting by 45 degrees with respect to a cleavage direction. Accordingly, the manufacturing method of this invention utilizes this characteristic of compound semiconductor substrate, and forms patterns on the substrate in this slanting direction and cuts the substrate in the same direction.

An embodiment of a manufacturing method of compound semiconductor device of this invention is described with reference to FIG. 2, which shows an alignment of a mask 1 and a wafer 2 used in this embodiment. The mask 1 has chip patterns 3 for exposing circuit patterns onto a surface of the wafer 2 during a photolithographic process. The chip patterns 3 are adapted to align with a direction slanting by 45 degrees with respect to the direction of the orientation flat OF of the wafer 2 when the mask 1 is positioned over the wafer 2 for exposure.

In this embodiment, all the chip patterns 3 of the mask 1 are exposed onto the wafer 2 by a single exposure step. Each of the compound semiconductor device patterns, for example FET patterns, of the mask 1 is formed on a corresponding portion of a GaAs wafer at the same time. The mask itself 1 is automatically manufactured based on CAD data, and has chip patterns 3 slanting by 45 degrees with respect to the edge of the mask 1.

Figure 2:
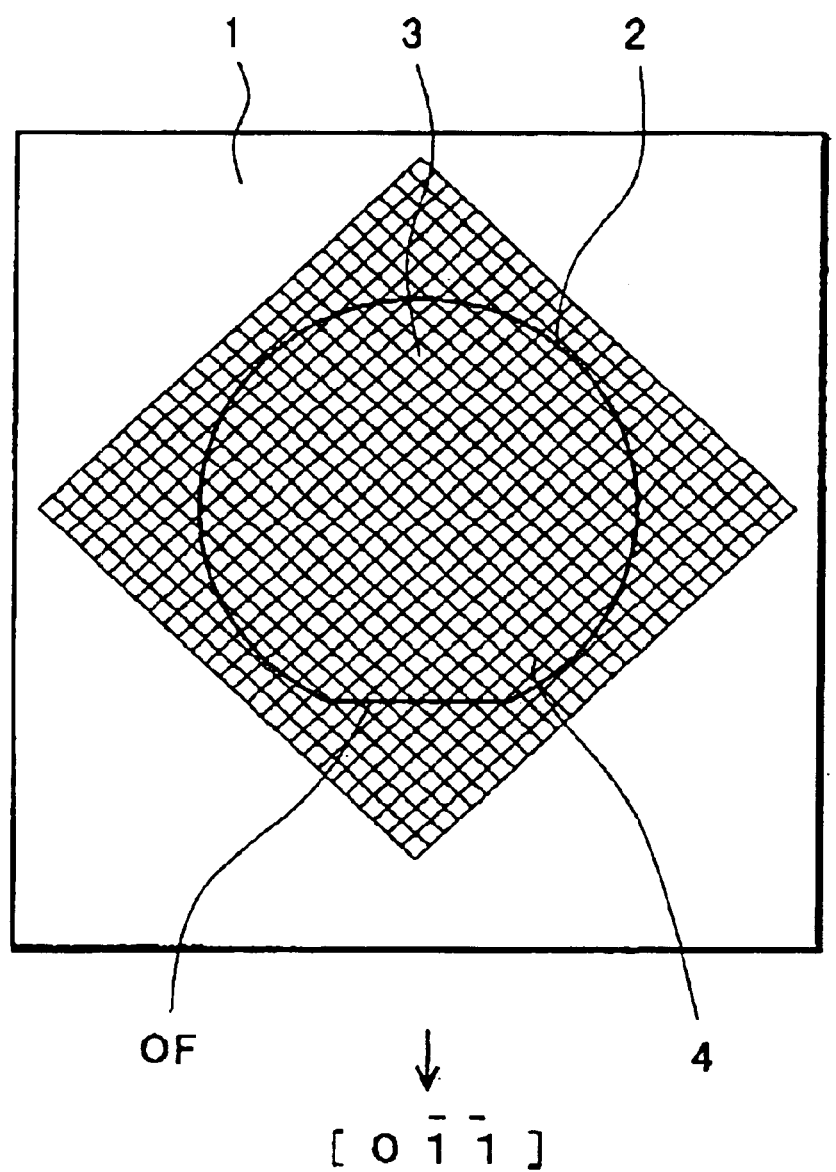
FIG. 2 shows an alignment of a mask and a wafer used in an embodiment of a method of manufacturing compound semiconductor device of this invention.

The top surface of the wafer 2 is a (1 0 0) surface of GaAs having a zincblende lattice structure, and the orientation flat OF of the wafer 2 is cut in a direction normal to a $[0\ \bar{1}\ \bar{1}]$ direction of GaAs, as denoted by an arrow shown in FIG. 2.

During the exposure step, the orientation flat OF is aligned in a direction parallel to one of the edges of the mask. In other words, the chip patterns 3 are aligned in a direction slanting by 45 degrees with respect to the orientation flat OF.

Figure 1:
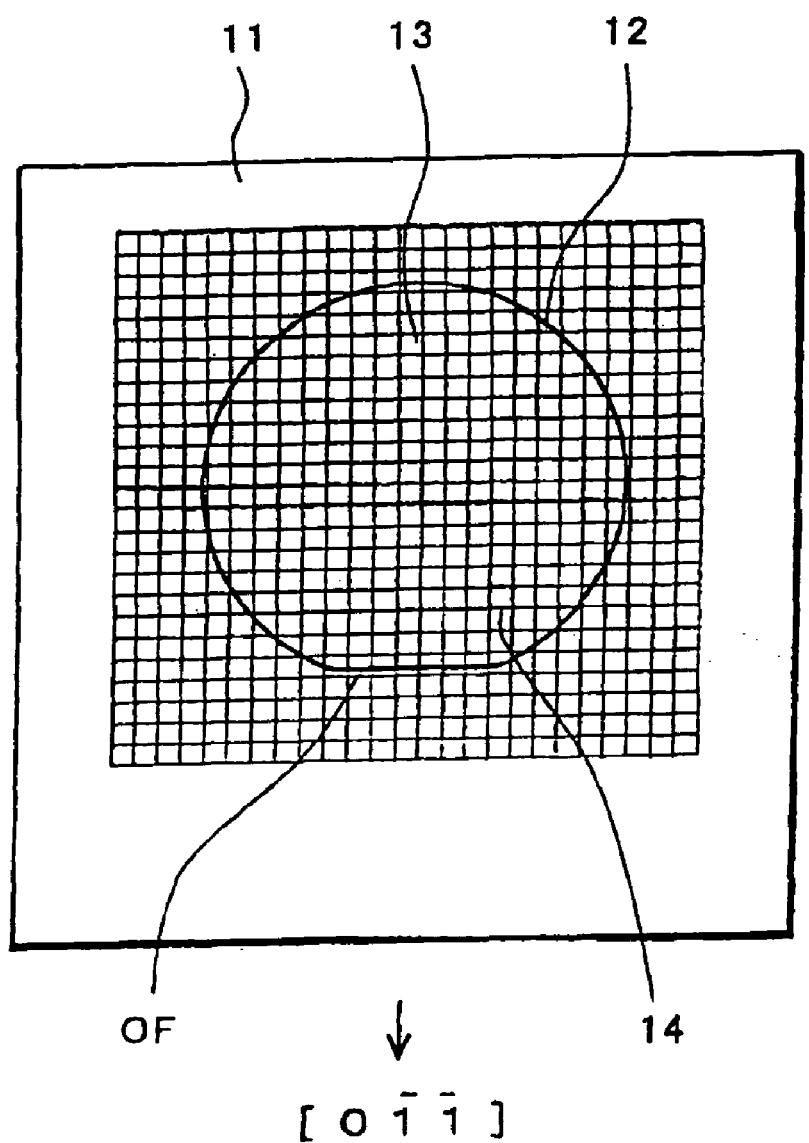
FIG. 1 shows an alignment of a mask and a wafer used in a conventional method of manufacturing compound semiconductor device.

After completion of device formation on the surface of the wafer 2 following the exposure step, the wafer 2 is diced in the direction slanting by 45 degrees with respect to the direction of the orientation flat OF of the wafer 2. In this step, the wafer 2 is, first, attached to a tape cut ring through a dicing sheet. Then, a dicing blade is positioned on a dicing region 4 of the wafer 2, and cuts the primary plane of the wafer 2 in the direction of the dicing region, i.e., the direction slanting by 45 degrees with respect to the orientation flat OF. When the wafer 2 is cut along this direction, chipping is greatly reduced on all edges of the device chip. Accordingly, the width of the dicing region 4 is reduced by 10 μm to 40 μm in comparison to the conventional manufacturing method shown in FIG. 1.

Furthermore, the cutting speed may be increased five to six times as high as that of conventional method. In this embodiment, the wafer 2 was cut with dicing conditions including a cutting speed of about 30 to 40 mm/sec and a blade spin rate of about 30000 to 35000 rpm, which are similar to the dicing conditions of silicon wafer.

After the dicing step, the individual chips of the wafer 2 are separated from each other by expanding the dicing sheet, and rinsed with water. After drying, the individual chips are sent to the next process, i.e., a bonding process.

As described above, dicing a primary surface of a compound semiconductor wafer having a (1 0 0) surface in a direction slanting by 45 degrees with respect to a $[0\ \bar{1}\ \bar{1}]$ direction of the wafer greatly reduces chipping along all edges of the individual chips. There is no need for specially manufactured wafers having different crystallographic orientation, or specially designed exposure apparatus. Accordingly, overall production yield increases because of reduced chipping, and effective use of expensive compound semiconductor wafer is achieved because of narrower dicing region. Furthermore, narrowing of the dicing region leads to smaller size of the device.

In this embodiment, the slanting angle between the alignment direction of the chip patterns and the orientation flat is 45 degrees. However, the slanting angle is not limited to this angle, but may be larger or smaller than this angle as long as the reduction of chipping is significantly reduced. For example, it maybe any angle between 30 and 60 degrees. Furthermore, the manufacturing method of this embodiment is not only applicable to formation of FETs on GaAs substrate, but also applicable to formation of MMIC and Schottky barrier diode, among other devices. The GaAs substrate may be replaced by other compound semiconductor substrate having a similar crystallographic structure.

The above is a detailed description of a particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A manufacturing method of compound semiconductor device comprising:
   providing a compound semiconductor wafer having an orientation flat;
   providing a mask having individual chip patterns;
   positioning the mask with respect to the wafer so that the individual chip patterns of the mask are aligned in a direction slanting with respect to the orientation flat;
   patterning the wafer using the mask positioned with respect to the wafer; and
   dicing the patterned wafer.

2. The manufacturing method of compound semiconductor device of claim 1, wherein
   a primary surface of the wafer comprises a (1 0 0) surface of a compound semiconductor or a crystallographically equivalent surface thereof,
   the orientation flat is formed normal to a [0 1 1] direction of the compound semiconductor or a crystallographically equivalent direction thereof, and
   the positioning of the mask comprises aligning the orientation flat in a same direction as an edge of the mask or aligning the orientation flat in a direction normal to the edge of the mask.

3. A manufacturing method of compound semiconductor device comprising:
   providing a compound semiconductor wafer having an orientation flat;
   providing a mask having individual chip patterns;
   positioning the mask with respect to the wafer so that the individual chip patterns of the mask are aligned in a direction slanting by an angle between 30 and 60 degrees with respect to the orientation flat;
   patterning the wafer using the mask positioned with respect to the wafer; and
   dicing the patterned wafer in the direction slanting by an angle between 30 and 60 degrees with respect to the orientation flat.

4. The manufacturing method of compound semiconductor device of claim 3, wherein
   a primary surface of the wafer comprises a (1 0 0) surface of a compound semiconductor or a crystallographically equivalent surface thereof,
   the orientation flat is formed normal to a [0 1 1] direction of the compound semiconductor or a crystallographically equivalent direction thereof, and
   the positioning of the mask comprises aligning the orientation flat in a same direction as an edge of the mask or aligning the orientation flat in a direction normal to the edge of the mask.

5. The manufacturing method of compound semiconductor device of claim 4, wherein the compound semiconductor comprises GaAs.

6. The manufacturing method of compound semiconductor device of claim 4, wherein the compound semiconductor comprises a zincblende lattice.

* * * * *